United States Patent
Liou et al.

(10) Patent No.: US 10,134,632 B2
(45) Date of Patent: Nov. 20, 2018

(54) LOW-K DIELECTRIC LAYER AND POROGEN

(71) Applicant: Taiwan Semiconductor Manufacturing Company, Ltd., Hsin-Chu (TW)

(72) Inventors: Joung-Wei Liou, Zhudong (TW); Hui-Chun Yang, Hsin-Chu (TW); Yu-Yun Peng, Hsin-Chu (TW); Keng-Chu Lin, Ping-Tung (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 15/425,558

(22) Filed: Feb. 6, 2017

(65) Prior Publication Data

US 2017/0148676 A1 May 25, 2017

Related U.S. Application Data

(60) Continuation of application No. 14/733,573, filed on Jun. 8, 2015, now Pat. No. 9,564,383, which is a (Continued)

(51) Int. Cl.
*H01L 21/76* (2006.01)
*H01L 21/768* (2006.01)
(Continued)

(52) U.S. Cl.
CPC .. *H01L 21/76879* (2013.01); *H01L 21/02123* (2013.01); *H01L 21/02203* (2013.01); *H01L 21/02211* (2013.01); *H01L 21/02274* (2013.01); *H01L 21/02321* (2013.01); *H01L 21/7682* (2013.01); *H01L 21/76801* (2013.01); *H01L 21/76829* (2013.01); *H01L 23/31* (2013.01); *H01L 23/481* (2013.01);
(Continued)

(58) Field of Classification Search
CPC .......... H01L 21/02203; H01L 21/7682; H01L 21/76802
See application file for complete search history.

(56) References Cited

U.S. PATENT DOCUMENTS

| 6,472,306 B1 | 10/2002 | Lee et al. |
| 7,670,924 B2 | 3/2010 | Demos et al. |

(Continued)

FOREIGN PATENT DOCUMENTS

| CN | 100340004 C | 9/2007 |
| KR | 20020048861 A | 6/2002 |

(Continued)

OTHER PUBLICATIONS

Korean Office Action, Patent Application No. 10-2011-0097083, dated May 31, 2013, 6 pages (translation included).

*Primary Examiner* — Julia Slutsker
(74) *Attorney, Agent, or Firm* — Slater Matsil, LLP

(57) ABSTRACT

A system and method for a low-k dielectric layer are provided. A preferred embodiment comprises forming a matrix and forming a porogen within the matrix. The porogen comprises an organic ring structure with fewer than fifteen carbons and a large percentage of single bonds. Additionally, the porogen may have a viscosity greater than 1.3 and a Reynolds numbers less than 0.5.

21 Claims, 6 Drawing Sheets

Related U.S. Application Data division of application No. 13/204,507, filed on Aug. 5, 2011, now Pat. No. 9,054,110.

(51) Int. Cl.
  *H01L 23/532* (2006.01)
  *H01L 21/02* (2006.01)
  *H01L 23/31* (2006.01)
  *H01L 23/48* (2006.01)

(52) U.S. Cl.
  CPC .... *H01L 23/5329* (2013.01); *H01L 23/53238* (2013.01); *H01L 23/53295* (2013.01); *H01L 2221/1047* (2013.01); *H01L 2924/0002* (2013.01); *H05K 999/99* (2013.01)

(56) References Cited

U.S. PATENT DOCUMENTS

| | | | |
|---|---|---|---|
| 7,892,985 | B1 | 2/2011 | Cho |
| 7,989,033 | B2 | 8/2011 | Yim et al. |
| 9,659,769 | B1 * | 5/2017 | Varadarajan ...... H01L 21/02348 |
| 2002/0074659 | A1 | 6/2002 | Dalton et al. |
| 2003/0114013 | A1 | 6/2003 | Hedrick et al. |
| 2005/0035455 | A1 | 2/2005 | Hu et al. |
| 2005/0064699 | A1 | 3/2005 | Kondo et al. |
| 2007/0200235 | A1 | 8/2007 | Ohkura |
| 2007/0243720 | A1 | 10/2007 | Ko et al. |
| 2008/0268177 | A1 * | 10/2008 | Vrtis ....................... C23C 16/30 427/585 |
| 2010/0123224 | A1 | 5/2010 | Lin et al. |
| 2010/0314777 | A1 | 12/2010 | Oda |
| 2010/0327456 | A1 | 12/2010 | Chen et al. |
| 2011/0239902 | A1 | 10/2011 | Wan et al. |
| 2012/0121823 | A1 * | 5/2012 | Chhabra ................... C23C 8/10 427/585 |

FOREIGN PATENT DOCUMENTS

| | | |
|---|---|---|
| KR | 20040079899 A | 9/2004 |
| TW | 200428494 A | 12/2004 |
| TW | 200845293 | 11/2008 |
| TW | 200946710 A | 4/2010 |
| TW | 201012962 A | 4/2010 |
| WO | 03054928 A2 | 7/2003 |

* cited by examiner

LOW-K DIELECTRIC LAYER AND POROGEN

This application is a continuation of U.S. patent application Ser. No. 14/733,573, filed on Jun. 8, 2015, and entitled "Low-K Dielectric Layer and Porogen," which application is a divisional of U.S. patent application Ser. No. 13/204,507, filed on Aug. 5, 2011, and entitled "Low-K Dielectric Layer and Porogen," now U.S. Pat. No. 9,054,110 issued on Jun. 9, 2015, which applications are hereby incorporated herein by reference in their entirety.

BACKGROUND

In the current process of miniaturizing semiconductor devices, low-k dielectric materials are desired as the intermetal and/or inter-layer dielectric between conductive interconnects in order to reduce the resistive-capacitive (RC) delay in signal propagation due to capacitive effects. As such, the lower the dielectric layer constant of the dielectric, the lower the parasitic capacitance of adjacent conductive lines and the lower the RC delay of the integrated circuit (IC).

A low-k dielectric layer may be formed by initially forming a precursor film. This precursor film may have two components such as a matrix material and a porogen material formed within the matrix material. Once the precursor film has been formed and solidified in the area in which the low-k dielectric material is desired, the porogen may be removed from the precursor film, thereby forming "pores" which lower the dielectric constant of the precursor film and form the low-k dielectric material.

However, the porogens currently in use, such as 1-isopropyl-1-4-methyl-1,3-cyclohexadiene (ATRP) or bicyclo (2.2.1)-hepta-2,5diene (BCHD), generally have poor flow characteristics as they are being used to form the low-k dielectric layer. In particular, these porogens may diffuse momentum ineffectively, causing variations in the cross-section of the flow as the porogens are being transported and causing an uneven distribution throughout the low-k-dielectric layer. Additionally, the use of these porogens may also form a low-k material that adheres poorly to underlying layers, and may also need higher energies in order to be incorporated within the precursor film and cross link within the precursor film.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of embodiments are discussed in detail below. It should be appreciated, however, that the embodiments provide many applicable concepts that can be embodied in a wide variety of specific contexts. The specific embodiments discussed are merely illustrative of specific ways to make and use the embodiments, and do not limit the scope of the embodiments.

The embodiments will be described with respect to embodiments in a specific context, namely forming a low-k dielectric layer for an interconnect with a porogen. The embodiments may also be applied, however, to other dielectric layers.

Figure 1:
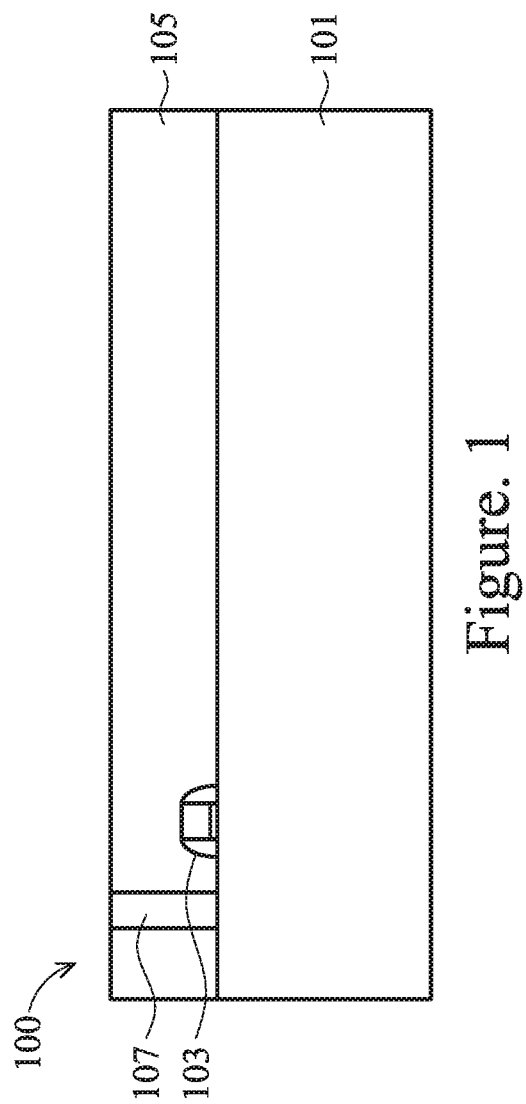
FIG. 1 illustrates a semiconductor device in accordance with an embodiment.

With reference now to FIG. 1, there is shown a semiconductor device 100 with a substrate 101, active devices 103, metallization layers 105, and a contact 107. The substrate 101 may comprise bulk silicon, doped or undoped, or an active layer of a silicon-on-insulator (SOI) substrate. Generally, an SOI substrate comprises a layer of a semiconductor material such as silicon, germanium, silicon germanium, SOI, silicon germanium on insulator (SGOI), or combinations thereof. Other substrates that may be used include multi-layered substrates, gradient substrates, or hybrid orientation substrates.

The active devices 103 are represented in FIG. 1 as a single transistor. However, as one of skill in the art will recognize, a wide variety of active devices such as capacitors, resistors, inductors and the like may be used to generate the desired structural and functional requirements of the design for the semiconductor device 100. The active devices 103 may be formed using any suitable methods either within or else on the surface of the substrate 101.

The metallization layers 105 are formed over the substrate 101 and the active devices 103 and are designed to connect the various active devices 103 to form functional circuitry. While illustrated in FIG. 1 as a single layer, the metallization layers 105 may be formed of alternating layers of dielectric and conductive material and may be formed through any suitable process (such as deposition, damascene, dual damascene, etc.). In an embodiment there may be one or more layers of metallization separated from the substrate 101 by at least one interlayer dielectric layer (ILD), but the precise number of metallization layers 105 is dependent upon the design of the semiconductor device 100. Additionally, the metallization layers 105 may not be all of the layers of conductive material that may be utilized to provide connections and route signals to and from the active devices 103.

The contact 107 may extend through one or more of the individual metallization layers 105 to make electrical contact with at least one of the active devices 103. The contact 107 may be formed through the one or more of the individual metallization layers 105 in accordance with known photolithography and etching techniques. Generally, photolithography techniques involve depositing a photoresist material, which is masked, exposed, and developed to expose portions of the one or more of the individual metallization layers 105 that are to be removed. The remaining photoresist material protects the underlying material from subsequent processing steps, such as etching. Photoresist material is utilized to create a patterned mask to define the contact 107. Alternative masks, such as a hardmask, may also be used.

Once the patterned mask has been formed, the contact 107 may be formed by initially etching the layers underlying the patterned mask and then forming the contact 107 within the patterned layers. In an embodiment the contact 107 may comprise a barrier/adhesion layer (not shown) to prevent diffusion and provide better adhesion between the contact 107 and the one or more of the individual metallization layers 105. In an embodiment, the barrier layer is formed of one or more layers of titanium, titanium nitride, tantalum, tantalum nitride, or the like. The barrier layer may be formed through chemical vapor deposition, although other techniques could alternatively be used. The barrier layer may be formed to a combined thickness of about 10 Å to about 500 Å.

The contact 107 may also comprise a suitable conductive material, such as a highly-conductive, low-resistive metal, elemental metal, transition metal, or the like. In an embodiment the contact 107 may be formed of tungsten, although other materials, such as copper, could alternatively be utilized. In an embodiment in which the contact 107 is formed of tungsten, the contact 107 may be deposited by chemical vapor deposition (CVD) techniques known in the art, although any method of formation could alternatively be used.

Figure 2:
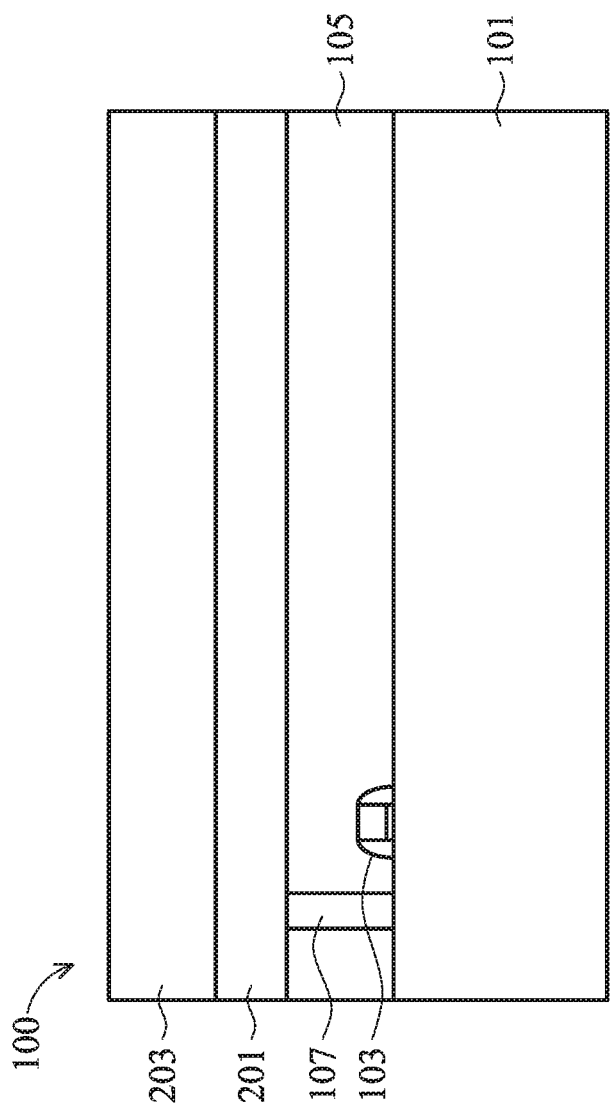
FIG. 2 illustrates the formation of a contact etch stop layer and a first dielectric layer in accordance with an embodiment.

FIG. 2 illustrates the formation of a first contact etch stop layer (CESL) 201 and a first dielectric layer 203. The first CESL 201 may be formed over the substrate 101 and the metallization layers 105. The first CESL 201 may be used to protect the substrate 101 and the metallization layers 105 from damage caused by further processing and provide for a control point for further etching processes. In one embodiment, the first CESL 201 may be formed of silicon nitride using plasma enhanced chemical vapor deposition (PECVD), although other materials such as nitride, oxynitride, carbide, boride, combinations thereof, or the like, and alternative techniques of forming the first CESL 201, such as low pressure CVD (LPCVD), PVD, or the like, could alternatively be used. The first CESL 201 may have a thickness of between about 50 Å and about 2,000 Å, such as about 200 Å.

The first dielectric layer 203 may be formed over the first CESL 201 and may be used to help further shield the metallization layers 105 while providing a transitional layer between the first CESL 201 and the overlying second dielectric layer 301. The first dielectric layer 203 may be, for example, an oxide layer, and may be formed by a process such as by CVD techniques using tetra-ethyl-ortho-silicate (TEOS) and oxygen as a precursor. However, other materials and processes may alternatively be utilized to form the first dielectric layer 203. In an embodiment, the first dielectric layer 203 may be formed to have a thickness of between about 10 Å and about 2000 Å, such as about 200 Å.

Figure 3:
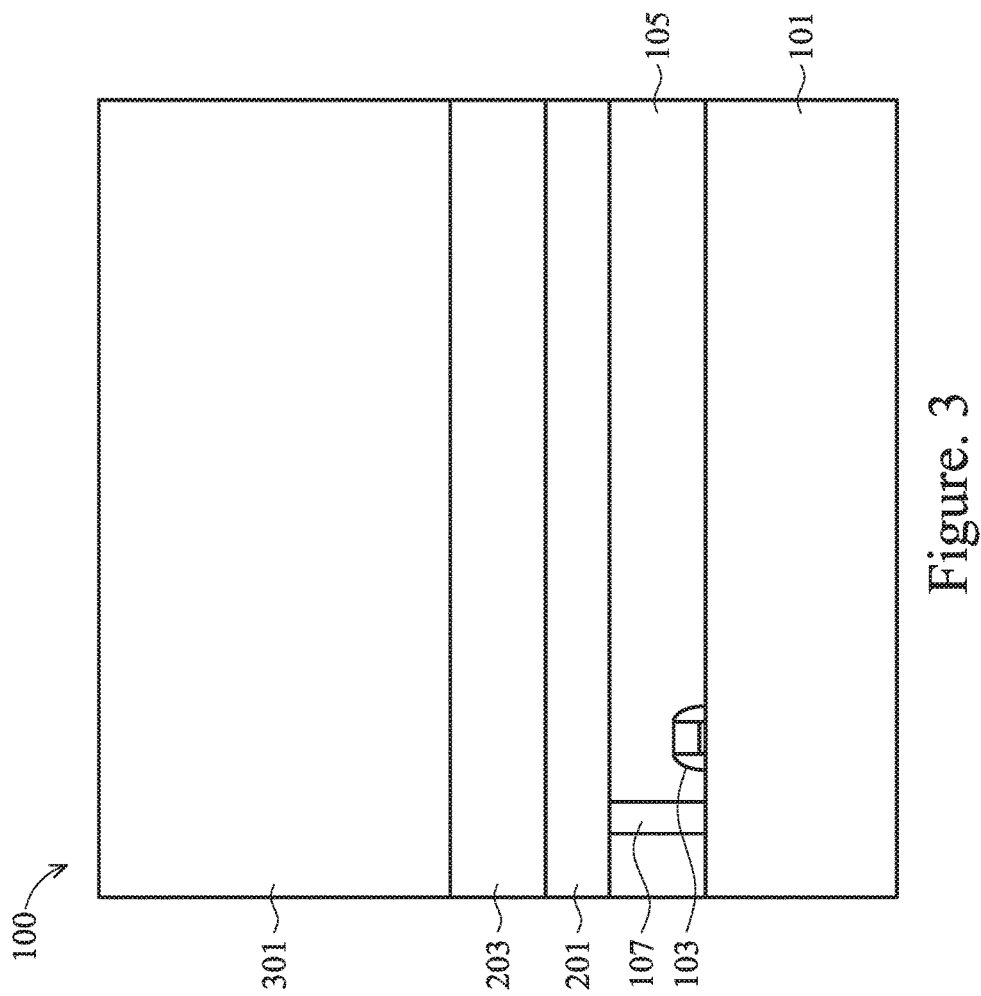
FIG. 3 illustrates the formation of a second dielectric layer in accordance with an embodiment.

FIG. 3 illustrates the formation of a second dielectric layer 301 over the first dielectric layer 203 and directly on the first dielectric layer 203 without an intervening initial layer (IL) or transition layer (TL). The second dielectric layer 301 may be, e.g., a low-k dielectric film intended to help isolate an interconnect 501 (not shown in FIG. 3 but illustrated and discussed below with respect to FIG. 5 below) from other structures within the semiconductor device 100. By isolating the interconnect 501, the resistance-capacitance (RC) delay of the interconnect 501 may be reduced, thereby improving the overall efficiency and speed of electricity through the interconnect 501.

In an embodiment the second dielectric layer 301 may be formed by initially forming a precursor layer over the first dielectric layer 203. The precursor layer may comprise both a matrix material and a porogen interspersed within the matrix material, or may alternatively comprise the matrix material without the porogen. In an embodiment the precursor layer may be formed, e.g., by co-depositing the matrix and the porogen using a process such as PECVD where the matrix material is deposited at the same time as the porogen, thereby forming the precursor layer with the matrix material and the porogen mixed together. However, as one of ordinary skill in the art will recognize, co-deposition using a simultaneous PECVD process is not the only process that may be used to form the precursor layer. Any suitable alternative process, such as premixing the matrix material and the porogen material as a liquid and then spin-coating the mixture onto the first dielectric layer 203, may also be utilized.

The precursor layer may be formed to a thickness sufficient to provide the isolation and routing characteristics that are desired of the second dielectric layer 301. In an embodiment, the precursor layer may be formed to a thickness of between about 10 Å and about 1000 Å, such as about 300 Å. However, these thicknesses are meant to be illustrative only, and are not intended to limit the scope of the embodiments, as the precise thickness of the precursor layer may be any suitable desired thickness.

The matrix material, or base dielectric material, may be formed using a process such as PECVD, although any suitable process, such as a CVD, PVD, or even spin-on coating, may alternatively be utilized. The PECVD process may utilize precursors such as methyldiethoxy silane (DEMS), although other precursors such as other silanes, alkylsilanes (e.g., trimethylsilane and tetramethylsilane), alkoxysilanes (e.g., methyltriethoxysilane (MTEOS), methyltrimethoxysilane (MTMOS), methyldimethoxysilane (MDMOS), trimethylmethoxysilane (TMMOS) and dimethyldimethoxysilane (DMDMOS)), linear siloxanes and cyclic siloxanes (e.g., octamethylcyclotetrasiloxane (OMCTS) and tetramethylcyclotetrasiloxane (TMCTS)), combinations of these, and the like may alternatively be utilized. However, as one of ordinary skill in the art will recognize, the materials and processes listed herein are merely illustrative and are not meant to be limiting to the embodiments, as any other suitable matrix precursors may alternatively be utilized.

The porogen may be a molecule that can be removed from the matrix material after the matrix material has set in order to form pores within the matrix and thereby reduce the overall value of the dielectric constant of the second dielectric layer 301. The porogen may be a material that is big enough to form the pores while also remaining small enough such that the size of the individual pores does not overly displace the matrix material. As such, the porogen may comprise an organic molecule that comprises one or more ring structures within the individual molecules of the porogen. Additionally, in order to reduce the size of the individual pores, the individual molecules of the porogen should have a small ring or small mass, such as having less than 15 carbon atoms contained within the molecule. By using a ring structure and having a small mass, the size of the individual pores that will be formed once the porogen is removed may be tailored to decrease the dielectric constant of the second dielectric layer 301.

The porogen may also be a material that can be easily incorporated into the existing processes and have a high mechanical property that allows it to easily bond and cross-link with other molecules, such as the underlying first dielectric layer 203. Both of these properties can be met by a material that has a large percentage of single bonds between the various atoms within the ring structure, such as greater than about 80% to about 100% of the bonds being single bonds. By having a large percentage of the bonds being single bonds, and not having a large number of double or triple bonds between atoms, the bonds between atoms can be easily broken and reformed in order to provide for an easy incorporation within the CVD process as well as allowing for the bonds to easily be broken so that the individual molecules can be more easily cross-linked between each other (and between layers) than a molecule with double or triple bonds.

By using a material with a large percentage of single bonds that easily cross-links, the second dielectric layer 301 may adhere more readily to an underlying layer, such as the first dielectric layer 203 illustrated in FIG. 3. By increasing the adherence of the second dielectric layer 301, the initial layer (IL) and transitional layer (TL) that has previously been utilized may be removed, and a gain of about 5% of the capacitance may be realized.

Additionally, the porogen may also be a material that has suitable flow characteristics in order to help obtain a more uniform and even flow through the manufacturing equipment (such as the gas distribution system 400 described below with respect to FIG. 4). By obtaining a more even flow, the porogen may be more evenly dispersed within the precursor layer during the formation process. For example, the porogen may be a material that has a viscosity greater than about 1.3 centipoise and has a Reynolds number of less than about 0.5. By having these characteristics, the momentum of the porogen may diffuse more rapidly across the flowing porogen and the porogen may have a more even flow pattern through the pipes (instead of the typical flow velocity where the porogen at the center of the pipes travels much faster than at the walls of the pipe) and through the showerhead (described further below with respect to FIG. 4). By utilizing this more even flow, the porogen may be more evenly dispersed throughout the matrix material, forming the second dielectric layer 301 to have a more even dielectric constant.

In an embodiment the porogen may be a cyclic, non-aromatic, small mass, high viscosity, small Reynolds number, single bonded molecule such as cyclooctane, which has a non-aromatic ring structure with eight carbon atoms, a high viscosity of 2.1 cPoise, a small Reynolds number of 0.397, and has single bonds throughout the ring structure. However, any suitable molecule that has one or more ring structures, a large percentage of single bonds between the atoms, a small mass, a high viscosity and a small Reynolds number, such as cycloheptane, cyclohexane, cyclodene, may alternatively be utilized. Additionally, one or more functional groups, such as a methyl group ($—CH_3$), an ethyl group ($—C_2H_5$), an isopropyl group ($—C_3H_7$) or the like may be linked at the side of the ring structure. These and all other suitable porogens as described herein are fully intended to be included within the scope of the embodiments.

After the precursor layer has been formed with the porogen dispersed within the matrix material, the porogen may be removed from the matrix material to form the pores within the matrix material. The removal of the porogen may be performed by an annealing process which can break down and vaporize the porogen material, thereby allowing the porogen material to diffuse and leave the matrix material, thereby leaving behind a structurally intact porous dielectric material as the second dielectric layer 301. For example, an anneal of between about 200° C. and about 500° C., such as about 400° C., for between about 10 seconds and about 600 seconds, such as about 200 seconds, may be utilized.

However, as one of ordinary skill in the art will recognize, the thermal process described above is not the only method that may be utilized to remove the porogen from the matrix material to form the second dielectric layer 301. Other suitable processes, such as irradiating the porogen with UV radiation to decompose the porogen or utilizing microwaves to decompose the porogen, may alternatively be utilized. These and any other suitable process to remove all or a portion of the porogen are all fully intended to be included within the scope of the embodiments.

Figure 4:
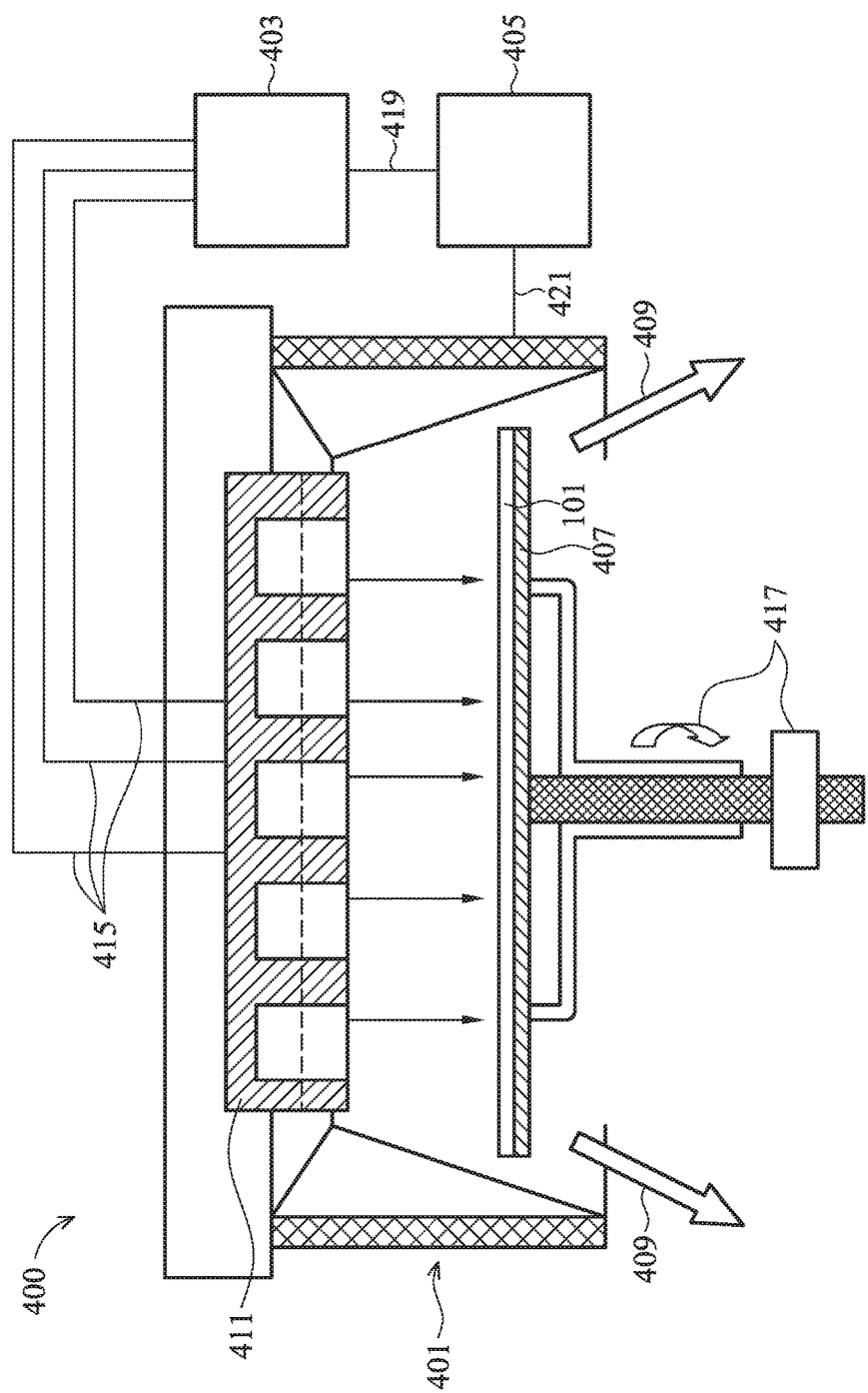
FIG. 4 illustrates a gas distribution system for forming the second dielectric layer in accordance with an embodiment.

FIG. 4 illustrates a gas distribution system 400 that may be utilized to form the second dielectric layer 301. The gas distribution system 400 may comprise chamber 401, gas input area 403, and controller 405. Chamber 401 may be capable of maintaining a vacuum, holding the substrate 101 (and its overlying layers such as the first CESL 201 and the first dielectric layer 203) onto a platen 407, and exhausting gases through exhaust ports 409. Further, showerhead 411 is disposed within chamber 401. Showerhead 411 may be connected to gas input area 413, which feeds gas into showerhead 411. Showerhead 411 may receive multiple gases simultaneously from gas input area 403, through gas pipes 415. Mechanisms 417 may be in place to structurally support, heat, and rotate the substrate 101. In another embodiment, chamber 401 may be configured to hold multiple work pieces.

Gas input area 403 may be internal to the gas distribution system 400, such as, for example, bottles of source gas, alternate gas sources, a valve system connected to an external gas distribution area, or the like. Alternately, gas input area 403 may be external to the gas distribution system 400. In any case, multiple gases may be input simultaneously to showerhead 411, and through showerhead 411, gases may be simultaneously delivered to the chamber 401.

The controller 405 may be any appropriate microprocessor unit, including a computer internal or external to the gas distribution system 400. The controller 405 may control the gas flow into showerhead 411 through connection 419. Further, the controller 405 may control the temperature of the substrate 101, the rotation of the substrate 101, the vacuum and/or pumping of chamber 401, and the like, through connection 421.

In an embodiment the controller 405 controls the gas input area 403 to introduce the matrix precursor and the porogen at the same time to the chamber 401. For example, to form the precursor layer, the matrix precursor may be introduced at a rate of between about 100 mg/min and about 4000 mg/min, such as about 2000 mg/min, while the porogen may be introduced at a rate of between about 500 mg/min and about 5000 mg/min, such as about 2000 mg/min, with an RF power of between about 100 W and about 2000 W, such as about 800 W. Additionally, oxygen may be introduced at a flow rate of between about 50 sccm and about 1000 sccm, such as about 200 sccm. Additionally, by utilizing the porogen as described above, the flow rates of the matrix precursor and the porogen may be introduced at a steady flow rate throughout the formation of the precursor layer (instead of initially starting at a lower flow rate of only the matrix material, then introducing the porogen at a low flow rate, and then ramping up to obtain a bulk of the material). The matrix precursors and the porogen co-deposit onto the first dielectric layer 203 in order to form the precursor layer. In an embodiment utilizing a cyclic, non-aromatic, small mass, high viscosity, small Reynolds number molecule with a large percentage of single bonds such as those described above, the porogen may be more evenly dispersed within the matrix material, leading to a more even dielectric constant, and the porogen may be easier to cross-link and be easier to incorporate within the manufacturing process.

Figure 5:
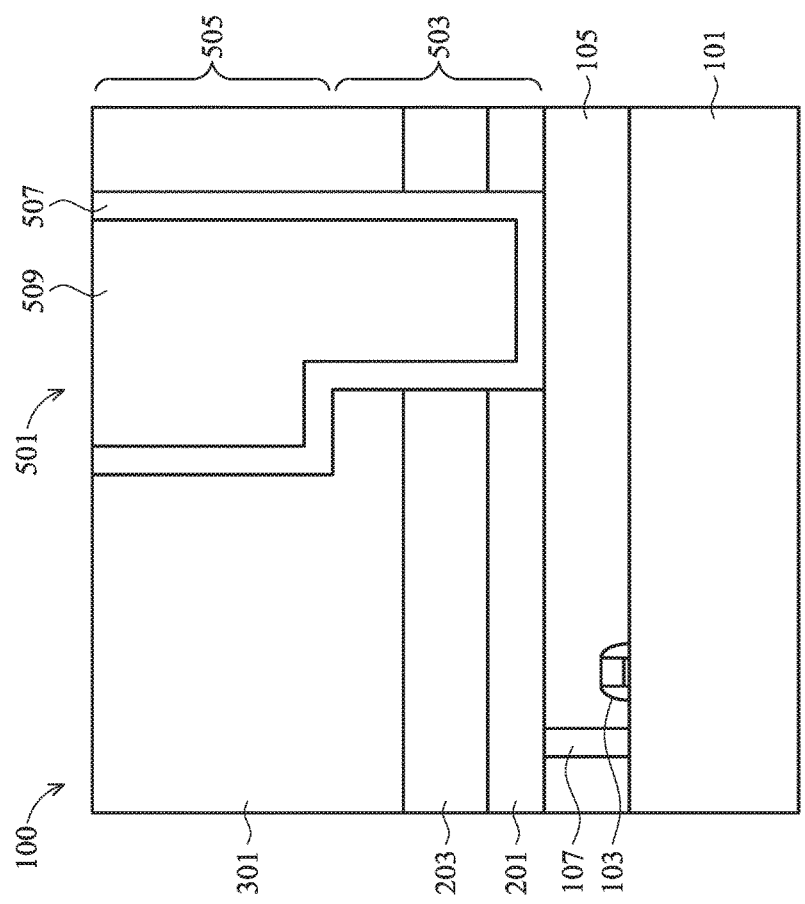
FIG. 5 illustrates the formation of an interconnect through the second dielectric layer in accordance with an embodiment.

FIG. 5 illustrates the formation of a interconnect 501 through the second dielectric layer 301, the first dielectric layer 203, and the first CESL 201. The interconnect 501 may be utilized to provide an electrical connection to the underlying metallization layers 105, and may, as illustrated in FIG. 5, be formed in a dual damascene configuration, which comprises both a via 503 and a trench 505 formed in the same processes. However, as one of ordinary skill in the art will recognize, the dual damascene configuration is not the only configuration that may be utilized to form the interconnect 501, and other configurations, such as a single damascene configuration or any other suitable method of formation, may alternatively be utilized.

In an embodiment the via 503 and trench 505 may be formed by initially using a two-step etching process. An initial first mask (not shown) may be applied to define the pattern of the via 503, and an etching process may be performed to etch the pattern of the via 503 into the second dielectric layer 301 to a depth of between about 1500 Å and about 300 Å, such as about 650 Å. The mask may be, for example, a photoresist material that has been applied, patterned, exposed, and developed. Other types of masks may be used.

After the pattern of the via 503 has been formed in the second dielectric layer 301, a second mask (also not shown) may be applied in the same manner as the first mask to define the pattern of the trench 505. A second etching process may then etch the pattern of the via 503 the remaining distance through the second dielectric layer 301, through the first dielectric layer 203, and through the first CESL 201 to expose the underlying metallization layers 105, thereby forming an opening for the via 503. The second etching process may concurrently form an opening for the trench 505 into the second dielectric layer 301. Thereafter, any remaining photoresist material may be removed.

After the openings for the via 503 and the trench 505 have been formed, the openings may be filled with a barrier/adhesion layer 507 and a conductive material 509. The barrier/adhesion layer 507 may be formed of one or more layers of conductive materials, such as titanium, titanium nitride, tantalum, tantalum nitride, or the like. In an embodiment the barrier/adhesion layer 507 may be formed of a thin layer of tantalum nitride and a thin layer of tantalum deposited by PVD techniques. In an embodiment, the combined thickness of the tantalum nitride and tantalum layers is about 50 Å to about 500 Å.

The conductive material 509 used to fill the openings for the via 503 and the trench 505 may be, for example, copper. The openings for the via 503 and the trench 505 may be filled, for example, by first depositing a seed layer (not shown) and then electroplating the conductive material 509 onto the seed layer until the conductive material 509 fills and overfills the openings for the via 503 and the trench 505. The conductive material 509 may alternatively comprise metals, elemental metals, transition metals, or the like.

Once the conductive material 509 has filled the openings for the via 503 and the trench 505, the barrier/adhesion layer 507 and the conductive material 509 may be planarized with the second dielectric layer 301. The planarization process may be, e.g., a chemical mechanical polish which chemically reacts and mechanically grinds to remove the conductive material 509 and the barrier/adhesion layer 507 until the conductive material 509 and the barrier/adhesion layer 507 are planar with the second dielectric layer 301. In an embodiment, when the planarization process has been completed the trench 505 may extend into the second dielectric layer a distance of between about 1500 Å and about 300 Å, such as about 650 Å, while the via 503 may extend below the trench 505 a distance of between about 1500 Å and about 300 Å, such as about 650 Å.

Figure 6:
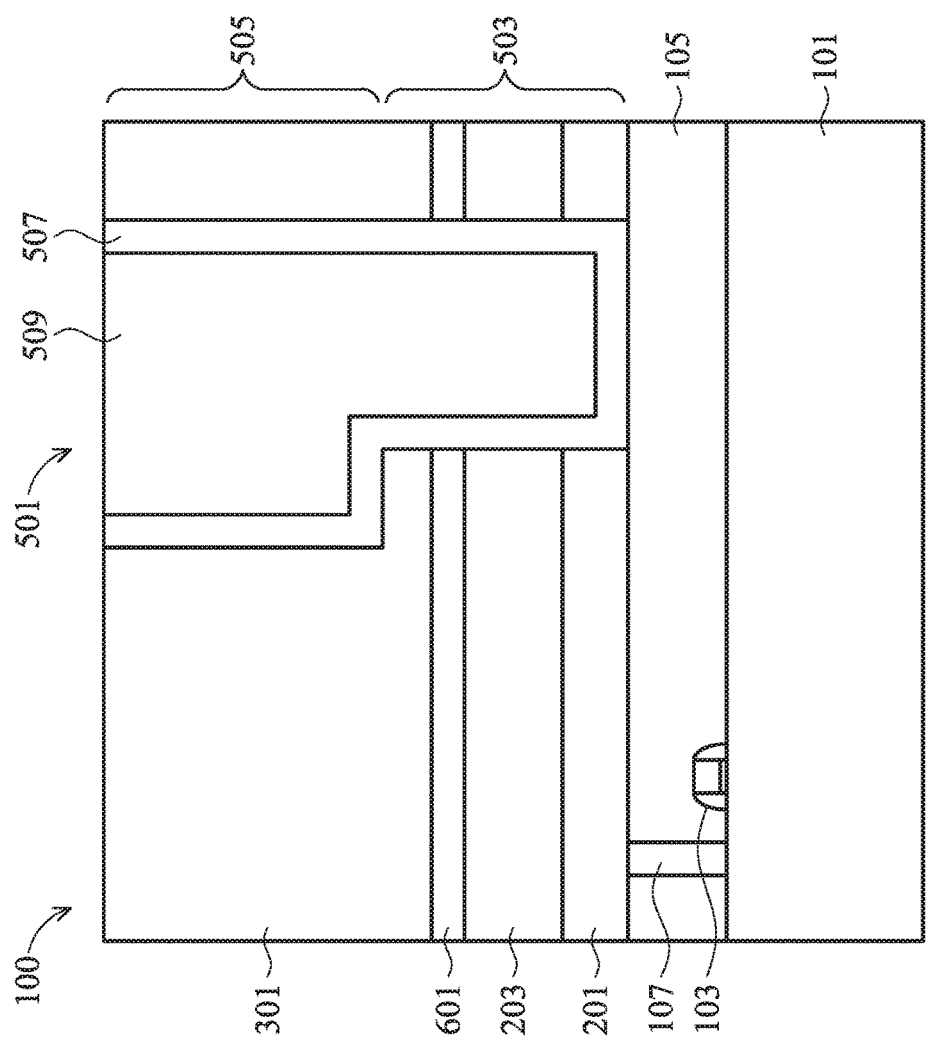
FIG. 6 illustrates a buffer layer formed between the second dielectric layer and the first dielectric layer in accordance with an embodiment.

FIG. 6 illustrates another embodiment in which an optional buffer layer 601 may be formed on the first dielectric layer 203 prior to the formation of the second dielectric layer 301. The buffer layer 601 may be made with the same processes and precursors as the second dielectric layer 301 (e.g., PECVD with DEMS and cyclooctane), but the deposition parameters may be modified in order to promote adhesion between the buffer layer 601 and the underlying first dielectric layer 203. For example, the flow rate of the porogen may be smaller for the buffer layer 601 than for the second dielectric layer 301 (described above with respect to FIGS. 3 and 4).

In an embodiment the flow rate of the porogen for the buffer layer 601 may be between about 100 mg/min and about 4000 mg/min, such as about 2000 mg/min, while the precursor for the matrix material may be less than about 5000 mg/min, such as about 1000 mg/min. Additionally, oxygen may be introduced at a flow rate of between about 50 sccm and about 1000 sccm, such as about 200 sccm, or the RF power may be adjusted to be between about 100 W and about 2000 W, such as about 800 W, in order to form the buffer layer 601.

By adjusting the parameters of deposition the adhesion of the dielectric material for the buffer layer 601 may be increased in order to help adhere the second dielectric layer 301 to the first dielectric layer 203. Additionally, by using the same materials as the second dielectric layer, the buffer layer 601 may only see a small difference between the dielectric constant of the buffer layer 601 and the dielectric constant of the second dielectric layer 301, thereby helping to improve the adhesion with a minimal effect on the overall dielectric constant of the semiconductor device 100. The thickness of the buffer layer 601 may be between about 10 Å and about 500 Å, such as about 150 Å.

By utilizing the cyclic, non-aromatic, small mass, high viscosity, small Reynolds number, molecule with a large percentage of single bonds as a porogen, the second dielectric layer 301 may have a low dielectric constant, such as 2.6 or lower, while maintaining a hardness of 2 GPa or larger and a Young's modulus of greater than about 14 GPa. These properties allow for a low dielectric constant with an easier process integration and a more even dispersal of pores within the second dielectric layer 301. This allows the second dielectric layer 301 to better isolate the interconnect 501 and other structures without also complicating the manufacturing process, helping the miniaturization of semiconductor devices to below the twenty-eight nanometer technology node, such as the twenty nanometer technology node, and beyond.

In accordance with an embodiment a method for manufacturing a semiconductor device comprising forming a first material over a substrate is provided. A second material is formed within the first material, wherein the second material is a porogen comprising a organic ring structure with a percentage of single bonds that is greater than about 80%.

In accordance with another embodiment a method for manufacturing a semiconductor device comprising forming a precursor layer by co-depositing a matrix material and a porogen onto a substrate is provided. The porogen comprises an organic molecule, the organic molecule having a carbon ring structure and fewer than fifteen carbon atoms, wherein bonds between each of the carbon atoms are only single bonds. The first dielectric layer is formed from the precursor layer by removing the porogen from the precursor layer.

In accordance with yet another embodiment, a semiconductor device comprising a substrate is provided. A dielectric layer is over the substrate, the dielectric layer having a hardness of at least 2 GPa and a k-value of less than about 2.6.

Although the present invention and its advantages have been described in detail, it should be understood that various changes, substitutions and alterations can be made herein without departing from the spirit and scope of the invention as defined by the appended claims. For example, the precise chemicals utilized for the porogen may be different from the illustrative embodiments presented herein. Additionally, other processes may be utilized to form the second dielectric layer while still remaining within the scope of the embodiments.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of manufacturing a semiconductor device, the method comprising:
    placing a semiconductor substrate into a deposition chamber;
    introducing a plurality of precursors into the deposition chamber to form a first dielectric layer, wherein a first set of the plurality of precursors deposits a matrix material and wherein a second set of the plurality of precursors deposits a porogen with a carbon ring structure and less than fifteen carbon atoms with single bonds, wherein the introducing the plurality of precursors is performed under a first set of deposition parameters for the deposition chamber, the first set of deposition parameters comprising a total gas flow rate into a showerhead, a temperature of the semiconductor substrate, or a rotation of the semiconductor substrate; and
    while maintaining the introducing the plurality of precursors, using a controller to adjust the first set of deposition parameters for the deposition chamber to a second set of deposition parameters for the deposition chamber to form a second dielectric layer, wherein the second dielectric layer has a lower adhesion than the first dielectric layer, wherein during the introducing the plurality of precursors under the first set of deposition parameters and under the second set of deposition parameters, a gas flow rate of the porogen and a gas flow rate of the matrix material remain constant.

2. The method of claim 1, wherein the introducing the plurality of precursors into the deposition chamber is part of a chemical vapor deposition process.

3. The method of claim 1, wherein the first set of deposition parameters comprises a first precursor flow rate of between about 100 mg/min and about 4000 mg/min.

4. The method of claim 1, wherein the second set of deposition parameters comprises the first precursor flow rate of between about 500 mg/min and about 5000 mg/min.

5. The method of claim 1, further comprising removing the porogen.

6. The method of claim 5, wherein the removing the porogen is performed at a temperature of between about 200° C. and about 500° C.

7. A method of manufacturing a semiconductor device, the method comprising:
    placing a semiconductor wafer into a deposition chamber;
    depositing a first dielectric layer comprising depositing a matrix material and a porogen with less than fifteen carbon atoms with single bonds and a carbon ring structure, wherein the matrix material and the porogen are deposited under a first set of parameters, wherein the depositing the matrix material and the porogen is performed at least in part by an introduction of precursors to the deposition chamber; and
    depositing a second dielectric layer by changing the first set of parameters without changing the introduction of the precursors to the deposition chamber, wherein the second dielectric layer has a lower adhesion than the first dielectric layer, wherein during depositing the first dielectric layer and depositing the second dielectric layer, each of the matrix material and the porogen have a constant flow rate.

8. The method of claim 7, wherein the changing the first set of parameters changes a RF power.

9. The method of claim 7, wherein the changing the first set of parameters changes a precursor flow rate.

10. The method of claim 7, wherein the porogen is cyclooctane.

11. The method of claim 7, wherein the porogen has a viscosity greater than about 1.3 centipoise.

12. The method of claim 7, wherein during the depositing the porogen, the porogen has a Reynolds number of less than about 0.5.

13. The method of claim 7, further comprising removing the porogen.

14. The method of claim 13, further comprising forming an interconnect structure through the second dielectric layer after the removing the porogen.

15. A method of manufacturing a semiconductor device, the method comprising:
    depositing a first dielectric layer over a semiconductor substrate, the first dielectric layer having a first adhesion;
    depositing a precursor layer directly onto the first dielectric layer with a first set of precursors and a first set of deposition parameters, wherein the precursor layer comprises:
        a matrix material; and
        a porogen which comprises less than fifteen carbon atoms, the carbon atoms being single bonded and comprising at least one cyclic structure;
    wherein during an entirety of the depositing the precursor layer, the matrix material and the porogen each have a constant flow rate, and wherein the first dielectric layer is a different material than the precursor layer;
    removing the porogen from the matrix material to form a second dielectric layer with a second adhesion; and a second set of deposition parameters being different from the first set of deposition parameters, wherein the first adhesion is greater than the second adhesion;

forming an opening through the first dielectric layer and the second dielectric layer; and forming a conductive via within the opening.

16. The method of claim 15, wherein the second dielectric layer has a thickness of between about 10 Å and about 500 Å.

17. The method of claim 15, wherein the first set of deposition parameters comprises a matrix precursor flow rate of between about 100 mg/min and about 4000 mg/min, such as about 2000 mg/min.

18. The method of claim 15, wherein the matrix material is deposited using methyldiethoxy silane (DEMS).

19. The method of claim 15, wherein the removing the porogen is performed at least in part with a thermal anneal.

20. The method of claim 19, wherein the thermal anneal is performed at a temperature of between about 200° C. and about 500° C.

21. The method of claim 7, wherein the introduction of precursors to the deposition chamber is part of a chemical vapor deposition process.

* * * * *